United States Patent

[11] 3,599,056

[72] Inventor James E. Clark
Coopersburg, Pa.
[21] Appl. No. 832,154
[22] Filed June 11, 1969
[45] Patented Aug. 10, 1971
[73] Assignee Bell Telephone Laboratories, Incorporated
Murray Hill, N.J.

[54] SEMICONDUCTOR BEAM LEAD WITH THICKENED BONDING PORTION

1 Claim, 4 Drawing Figs.

[52] U.S. Cl. .......... 317/234 R, 317/234 J, 317/234 N
[51] Int. Cl. .......... H01l 3/00, H01l 5/00
[50] Field of Search .......... 317/234, 235, 5, 5.4, 22, 22.1

[56] References Cited

UNITED STATES PATENTS

| | | | |
|---|---|---|---|
| 3,440,027 | 4/1969 | Hugle | 317/234 |
| 3,445,925 | 5/1969 | Lesk | 317/234 |
| 3,449,825 | 6/1969 | Loro | 317/234 |
| 3,474,303 | 10/1969 | Lutz | 317/234 |

*Primary Examiner*—John W. Huckert
*Assistant Examiner*—Andrew J. James
*Attorneys*—R. J. Guenther and Edwin B. Cave ABSTRACT: In semiconductor devices having beam leads a protuberant portion is provided on the bonding face of the beam at its outer end. This thickened portion controls the bonding area subjected to thermocompression bonding and avoids the deleterious effects which otherwise result from deformation and extrusion of the outer end of the beam lead.

INVENTOR
J. E. CLARK
BY H.W. Lockhart
ATTORNEY

SEMICONDUCTOR BEAM LEAD WITH THICKENED BONDING PORTION

BACKGROUND OF THE INVENTION

Semiconductor devices having supporting beam lead interconnecting members are described in M. P. Lepselter U.S. Pat. No. 3,426,252. Typically, beam lead semiconductors are connected to metallized circuit patterns or other types of substrates by a thermocompression bonding process utilizing bonding heads to deform the outer ends of the beam leads under slightly raised temperatures to produce metal joining. The technique is generally well known and is exemplified by the disclosure of O. L. Anderson and H. Christensen, U.S. Pat. No. 3,006,067.

However, in bonding semiconductor devices having a plurality of beam leads projecting from the periphery of a wafer of semiconductor material, the thermocompression bonding operation tends to produce an inward flow of metal in the beam lead toward the portion of the beam affixed to the semiconductor body. As a consequence of this effect there is a tendency to distort the beam and raise the semiconductor wafer off of the mounting substrate. This undesirable consequence, referred to as "bugging" results in a structure which is less rugged mechanically and may also fail to meet certain dimensional tolerances.

Accordingly, an object of this invention is a beam lead structure which can be thermocompression bonded in a more controllable and facile manner without producing an unwanted movement of the semiconductor body as a consequence of the mechanical bonding operation.

SUMMARY OF THE INVENTION

In accordance with a basic aspect of the invention beam lead members are fabricated with a thickened portion at the outer end of the beam lead. The added thickness is provided on the underside or bonding face of the beam lead which is adjacent to the metallized area to which the lead is to be joined. Consequently, when the bonding head is applied to the top surface of the beam lead, contact with the substrate circuit pattern contact is made only over the thickened or protuberant portion of the underside of the beam lead. As pressure is applied during the bonding operation and deformation of the beam lead occurs, flow of metal occurs in a controlled fashion and is not constrained to flow into the portion of the beam between the bonding area and the semiconductor wafer. It is this latter type of flow which occurs in the standard beam leads of uniform thickness which tends to result in the deleterious effect of "bugging." Rather, using the thickened-end type of beam lead in accordance with this invention flow of metal may occur outwardly away from the semiconductor device as well as inwardly to the portion of lesser thickness without producing any tendency of the beam to distort by bending upward and lifting the semiconductor wafer off of the substrate.

Thus, a feature of this invention is a beam lead configuration which is readily fabricated with only slight modification of prior fabrication techniques which provides more certain thermocompression bonding of leads without the deleterious consequences of "bugging."

BRIEF DESCRIPTION OF THE DRAWING

The invention and its other objects and features will be more clearly understood from the following detailed description taken in conjunction with the drawing in which.

DETAILED DESCRIPTION

Figure 1:
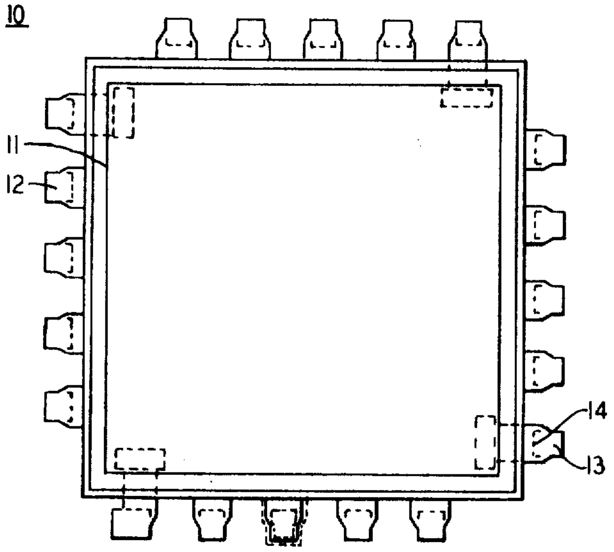
FIGS. 1 and 2, respectively, are a plan and side elevation view of a square semiconductor wafer having beam lead interconnecting members in accordance with this invention.

Referring to the drawing, FIG. 1 is exemplary of a beam lead semiconductor device 10 in which the beam lead members have a thickened outer end portion. The semiconductor body in the device 10 is shown as a square wafer 11 which may be of any generally known semiconductor material, but typically of silicon or germanium. The metallurgy of the beam leads described in the above-noted patent of M. P. Lepselter is particularly suitable for use with semiconductor bodies of monocrystalline silicon containing multiple diffused PN junctions.

As shown in FIG. 1 the semiconductor device 10 includes an array of 20 self-supporting beam leads 12. As is known in the art, these beam leads are produced typically by an electroforming technique and are built up on the underface of the semiconductor body 11 and connect with metal interconnections of the underface of the wafer 11. The beam leads 12 thus provide the means for external interconnection of the circuit elements of the semiconductor integrated circuit device 10.

Figure 2:
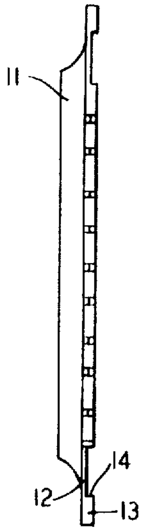
Figure 3:
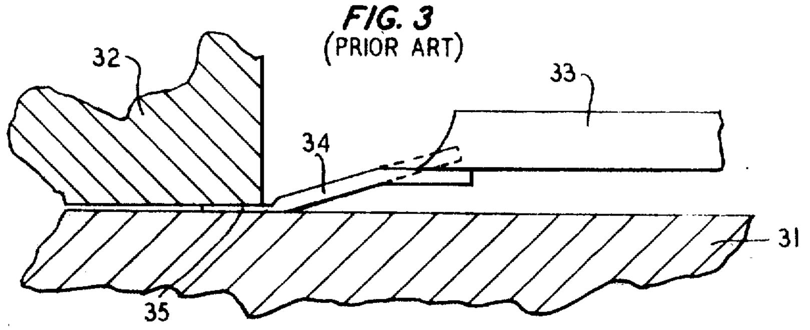
FIG. 3 (PRIOR ART)
FIG. 3 is a schematic illustration showing the thermocompression bonding of a standard, uniform thickness beam lead device.
Figure 4:
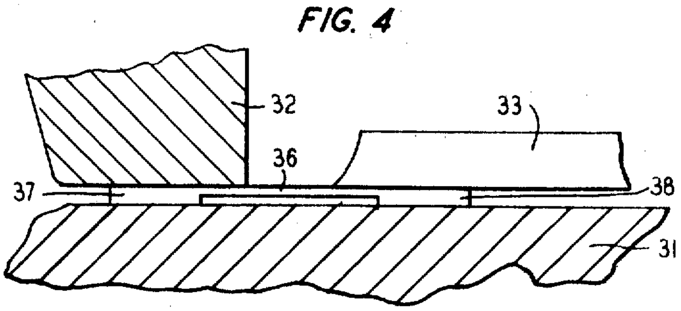
FIG. 4 is a similar schematic illustration showing thermocompression bonding of a thickened beam lead in accordance with this invention.

The beam lead members 12 have a thickened-end portion 13 indicated in the plan view of FIG. 2 as defined by the broken line 14. The extent of this thickened or protuberant portion is shown in the side elevation of FIG. 2 wherein similar reference numerals are used insofar as is appropriate. In general, the thickened portion may be of the order of twice as thick as the remaining portion of the beam lead. In a typical embodiment the standard beam lead may have a thickness of 0.3 mil (0.0003 inch). The thickened portion of the beam lead may have a thickness of about 0.6 mil. The effect of this added thickness applied at the outer end of the beam lead is illustrated in FIGS. 3 and 4. As shown in FIG. 4, it is advantageous to provide a portion 38 of similar added thickness at the inner end of the beam lead. This tends to ensure the desired final clearance between the wafer and substrate.

FIG. 3 shows in schematic form the effect of thermocompression bonding upon a beam lead of standard, uniform thickness. The substrate 31 is assumed to include a metallized portion to which the beam lead is to be bonded. As shown, the bonding head 32 has been applied to the outer end 35 of the beam lead and has reduced it by deformation to a thickness of typically half or less than the original thickness. It can be seen that there is a flow of metal within the lead as a consequence of this deformation generally inward toward the semiconductor wafer 33. This flow results in a distortion and stress in the portion 34 of the beam adjoining the bond which is relieved in part by an upward bending of the beam raising the semiconductor wafer off of the substrate. This effect, commonly referred to as "bugging," results in a configuration which is undesirable. The increased spacing between the substrate and the silicon reduces the capillary force which otherwise aids in subsequently filling this space with water repellent compound injected for protection. The greater the space the greater will be the unrelieved stresses set up between the compound and the chip structure, thereby rendering the overall arrangement less sturdy. Moreover, the increased spacing increases the thermal impedance between the semiconductor wafer and the substrate through the compound and thus inhibits heat dissipation.

In accordance with this invention the high beam structure shown in FIG. 4 enables a controlled bonding operation. The end portion 37 of the beam may have a thickness as set forth above of about 0.6 mil and the adjoining portion 36 of the beam a thickness of 0.3 mil. The beam lead may have an overall length of about 6 mils. The thickened-end portion may be about 2 mils in length thus constituting the thickened protuberant portion a 2 mil ×2 mil area. As shown in FIG. 4, the bonding head 32 is applied on the top surface of the beam lead and, because of the protuberant portion 37 on the underside, need not be precisely positioned other than insuring that it does not contact the semiconductor wafer. The application of the bonding force results in deformation of the protuberant portion. Cold flow of metal is constrained to the outer end of the beam lead and there is no tendency to distort and thus stress the connecting portion of the beam lead. Consequently, "bugging" does not occur.

The foregoing dimensions and structural details are presented as exemplary and are not intended to be limiting. Departures therefrom may be devised by those skilled in the art which still will utilize the principle in accordance with this invention.

What I claim is:

1. A semiconductor device including a semiconductor body and at least one beam lead member affixed in part to the semiconductor body and projecting in part from said semiconductor body for making external electrical connection to said body by means of a bonding operation which includes deformation of a portion of the projecting part of said beam lead, said portion having a greater thickness than the remaining projecting part of said beam lead between said portion and said semiconductor body, said portion of greater thickness having a thickness of about 0.6 mil and said remaining projecting part between said portion and said semiconductor body having a thickness of about 0.3 mil.